US007001796B2

(12) United States Patent
Cho et al.

(10) Patent No.: US 7,001,796 B2
(45) Date of Patent: Feb. 21, 2006

(54) METHOD FOR FABRICATING ARRAY SUBSTRATE OF LIQUID CRYSTAL DISPLAY DEVICE

(75) Inventors: Heung Lyul Cho, Suwon-shi (KR); Seung Hee Nam, Suwon-shi (KR); Jae Young Oh, Uiwang-shi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/875,318

(22) Filed: Jun. 25, 2004

(65) Prior Publication Data

US 2005/0101044 A1     May 12, 2005

(30) Foreign Application Priority Data

Oct. 28, 2003  (KR)  ............... 10-2003-0075508

(51) Int. Cl.
*H01C 21/00*  (2006.01)
(52) U.S. Cl. ........................ 438/104; 438/151
(58) Field of Classification Search ............... 438/30, 438/104, 151
See application file for complete search history.

(56) References Cited

U.S. PATENT DOCUMENTS 6,724,010 B1 *   4/2004  Kwasnick et al. ............ 257/59
2002/0149710 A1 *  10/2002  Kim ............................ 349/43

* cited by examiner

*Primary Examiner*—Matthew Smith
*Assistant Examiner*—Jarrett Stark
(74) *Attorney, Agent, or Firm*—McKenna Long & Aldridge LLP

(57) ABSTRACT

An array substrate of a liquid crystal display (LCD) device and a method for fabricating the same is disclosed, to decrease the unit cost and time of fabrication by decreasing the usage count of mask, which includes simultaneously forming a gate line, a gate electrode and a pixel electrode on a substrate; depositing a gate insulating layer and an active layer on an entire surface of the substrate including the gate line; patterning the gate insulating layer and the active layer to remain on the gate line and the gate electrode; selectively removing the active layer above the gate line; forming a data line perpendicular to the gate line and source/drain electrodes; and depositing a passivation layer on the entire surface of the substrate including the data line.

21 Claims, 13 Drawing Sheets

METHOD FOR FABRICATING ARRAY SUBSTRATE OF LIQUID CRYSTAL DISPLAY DEVICE

This application claims the benefit of Korean Patent Application No. P2003-75508, filed on Oct. 28, 2003, which is hereby incorporated by reference for all purposes as if fully set forth herein.

BACKGROUND OF THE INVENTION

1. Field of the Invention

The present invention relates to a liquid crystal display (LCD) device, and more particularly, to a method for fabricating an array substrate of an LCD device, to decrease the number of masks used.

2. Discussion of the Related Art

Liquid crystal display (LCD) devices have been widely used due to the advantageous characteristics of high contrast ratio, improved gray and image display and low power consumption. To operate the LCD device, it is necessary to form various patterns of driving devices or lines on a substrate of the LCD device, wherein photolithography is generally used to form patterns on the substrate. To form the patterns on the substrate by photolithography, a photoresist coats the substrate to sense ultraviolet rays, the photoresist is exposed and developed to form a pattern using a mask on the photoresist, the material layers are etched by using the patterned photoresist as a mask, and then the photoresist is stripped.

In an array substrate for the LCD device according to the related art, it requires 5 to 7 masks to form a gate line layer, a gate insulating layer, a semiconductor layer, a data line layer, a passivation layer and a pixel electrode, whereby the probability of process errors increase and process yield decrease. In order to overcome these problems, low-mask technology has been actively studied, which improves productivity and obtains the process margin by fabricating the array substrate using the minimum number of masking and photolithography steps.

Hereinafter, a method for fabricating an array substrate of an LCD device according to the related art will be described with reference to the accompanying drawings.

FIG. 1 is a flow chart illustrating a method for fabricating an array substrate of an LCD device according to the related art. FIG. 2A to FIG. 2C' are plane and cross-sectional views illustrating the fabrication process of an array substrate according to the related art.

To form the array substrate of the LCD device according to the related art, as shown in FIG. 1, a metal layer is deposited on a substrate, to form a gate line layer (S11 and S12). Then, a gate insulating layer is formed on an entire surface of the substrate including the gate line layer (S13), and an active layer is formed on the gate insulating layer overlapping with a predetermined portion of the gate line layer (S14). Next, a data line layer is formed to make a predetermined pattern with the gate line layer (S15), and a passivation layer having a contact hole is deposited on the data line layer (S16). After that, a pixel electrode is connected with a predetermined portion of the data line layer through the contact hole (S17). As a result, the array substrate for the LCD device is completed. The array substrate requires 5 masks in the steps of S12, S14, S15, S16 and S17.

A method for fabricating the array substrate for the LCD device according to the related art will be described in detail below.

First, as shown in FIGS. 2A & 2A' a low-resistance metal layer, e.g., copper Cu, aluminum Al, aluminum neodymium AlNd, molybdenum Mo or chrome Cr, is deposited on a glass substrate 11, and photolithography using a first mask is carried out to form a plurality of gate line layers, including a gate line 12 and a gate electrode 12a.

Photolithography includes forming the low-resistance metal layer on the transparent glass substrate having great heat-resistance characteristics and depositing a photoresist thereon. Then, the patterned first mask is positioned over the photoresist, and light is selectively irradiated thereto, whereby the same pattern as that of the first mask is formed on the photoresist. Next, the photoresist irradiated with the light is removed by an etchant, thereby leaving a photoresist pattern.

For reference, the etching process may be classified as a dry-etching method and a wet-etching method, wherein the dry-etching method removes a lower layer exposed below the photoresist with plasma gases or radicals, and the wet-etching method uses a chemical solution. Also, the dry-etching method is generally used to etch an insulating layer, which requires an accurate pattern. The wet-etching method is generally used to etch a metal material or a transparent electrode, and the wet-etching method uses low-priced fabrication equipment and has great productivity.

Next, an inorganic layer of silicon nitride $SiN_x$ or silicon oxide $SiO_x$ is deposited on the entire surface of the substrate including the gate line 12 at a high temperature, thereby forming a gate insulating layer 13. Subsequently, an island-shaped semiconductor layer 14 is formed by photolithography using a second mask on the gate insulating layer 13 overlapping the gate electrode 12a. At this time, the semiconductor layer 14 is formed by depositing an amorphous silicon (a-Si:H) at a high temperature. The gate insulating layer 13 and the semiconductor layer 14 are generally deposited by PECVD (Plasma Enhanced Chemical Vapor Deposition), which is carried out at a temperature of approx. 250° C. or more.

Referring to FIGS. 2B & 2B', a low-resistance metal layer, for example, copper Cu, aluminum Al, aluminum neodymium AlNd, molybdenum Mo or chrome Cr is deposited on the entire surface of the substrate including the semiconductor layer 14 and patterned by photolithography using a third mask, thereby forming a data line layer. The data line layer includes a data line 15 substantially perpendicular to the gate line 12, and source drain electrodes 15a and 15b overlapping both sides of the semiconductor layer 14. The deposited gate electrode 12a, the gate insulating layer 13, the semiconductor layer 14 and the source/drain electrodes 15a and 15b form a thin film transistor controlling a data voltage applied to the unit pixel region.

Next, as shown in FIGS. 2C & 2C' an organic insulating layer of BCB or an inorganic insulating layer of $SiN_x$ is deposited on the entire surface of the substrate including the data line 15, to form a passivation layer 16. Then, some of the passivation layer 16 is selectively removed by photolithography using a fourth mask, thereby forming a contact hole exposing the drain electrode 15b. Also, a transparent conductive layer of ITO (Indium-Tin-Oxide) or IZO (Indium-Zinc-Oxide) is formed on the entire surface of the substrate including the passivation layer 16, and patterned by photolithography using a fifth mask, whereby a pixel electrode 17 is electrically connected with the drain electrode 15b, thereby completing the array substrate of the LCD device. Thereafter, although not shown, the array substrate forming the thin film transistor TFT is bonded to an opposing substrate by a sealant with spacers between the two substrates. Then, liquid crystal is injected between the two substrates, to form a liquid crystal layer, and then an inlet for injection of liquid crystal is sealed, thereby completing the LCD device.

However, the array substrate for the LCD device according to the related art and the method for fabricating the same have following disadvantages.

The method for fabricating the array substrate of the LCD device according to the related art requires 5 masks when forming the gate line layer, semiconductor layer, the data line layer, the contact hole of the passivation layer and the pixel electrode, thereby lowering fabrication efficiency due to the complicated fabrication process and the increase of fabrication time and cost.

SUMMARY OF THE INVENTION

Accordingly, the present invention is directed to an array substrate of a liquid crystal display (LCD) device and a method for fabricating the same that substantially obviates one or more problems due to limitations and disadvantages of the related art.

An object of the present invention is to provide an array substrate of a liquid crystal display (LCD) device and a method for fabricating the same in order to decrease the unit cost and time of fabrication by decreasing the number of masks used.

Additional advantages and features of the invention will be set forth in part in the description which follows and in part will become apparent to those having ordinary skill in the art upon examination of the following or may be learned from practice of the invention. These and other advantages of the invention may be realized and attained by the structure particularly pointed out in the written description and claims hereof as well as the appended drawings.

To achieve these and other advantages and in accordance with the purpose of the invention, as embodied and broadly described herein, a method for fabricating an array substrate of an LCD device includes simultaneously forming a gate line, a gate electrode and a pixel electrode on a substrate; depositing a gate insulating layer and an active layer on an entire surface of the substrate including the gate line; patterning the gate insulating layer and the active layer to remain on the gate line and the gate electrode; selectively removing the active layer above the gate line; forming a data line perpendicular to the gate line and source/drain electrodes; and depositing a passivation layer on the entire surface of the substrate including the data line.

The array substrate of the LCD device according to the present invention requires 3 masks, whereby it is possible to decrease the fabrication cost and time by decreasing the number of masks used.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE ILLUSTRATED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Hereinafter, an array substrate of an LCD device according to the present invention and a method for fabricating the same will be described with reference to the accompanying drawings.

Figure 1:
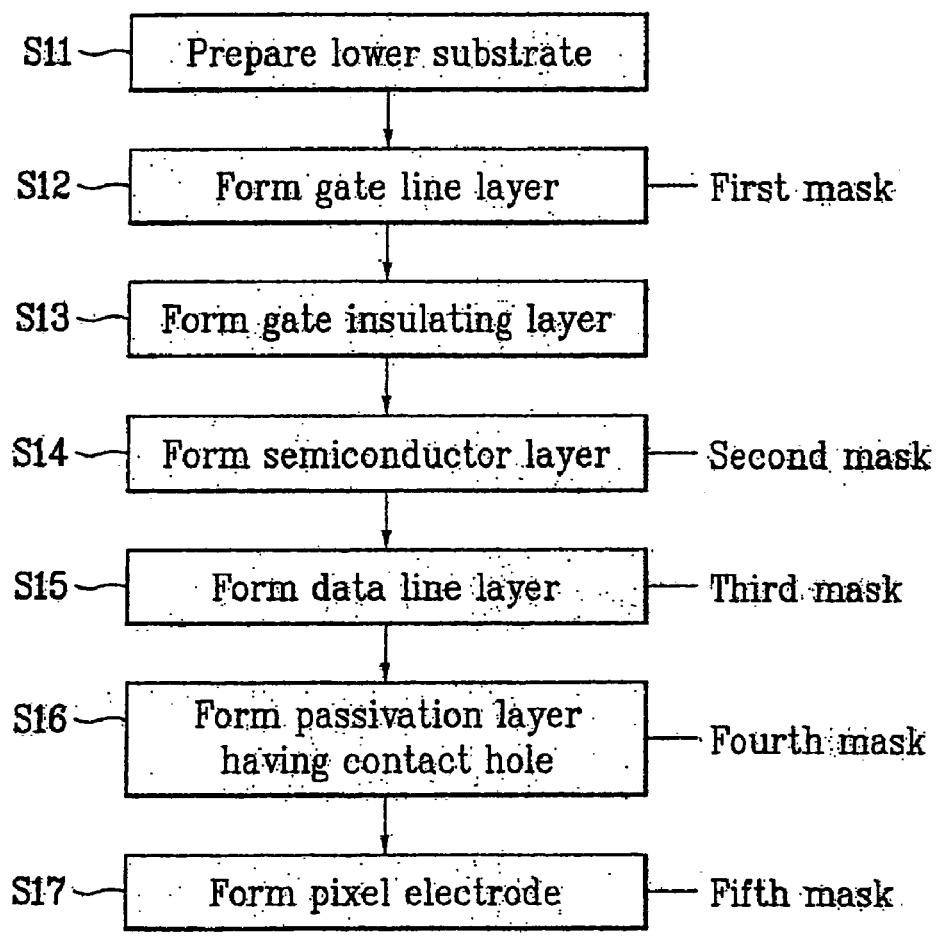
FIG. 1 is a flow chart illustrating the fabrication process of an array substrate according to the related art.
Figure 2A:
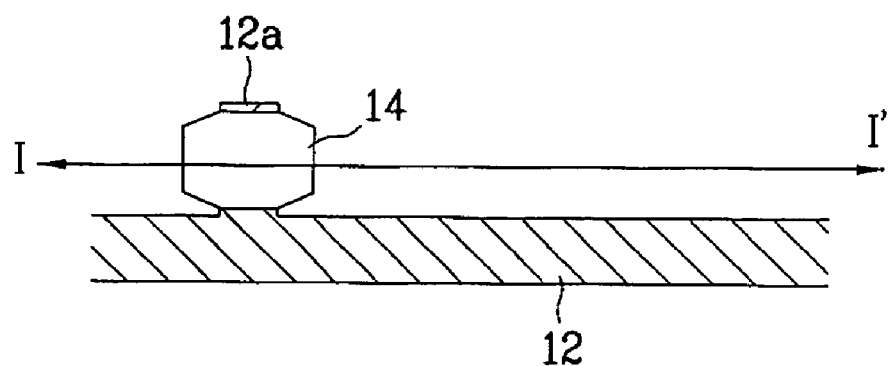
FIG. 2A to FIG. 2C' are plan and cross-sectional views illustrating the fabrication process of an array substrate according to the related art.
Figure 2A:
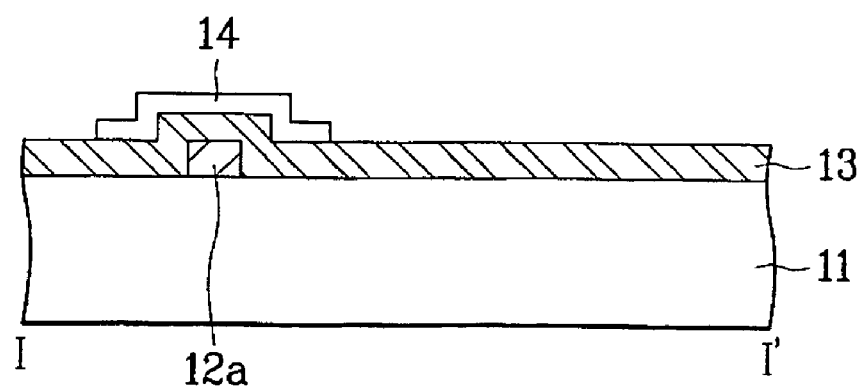
Figure 2B:
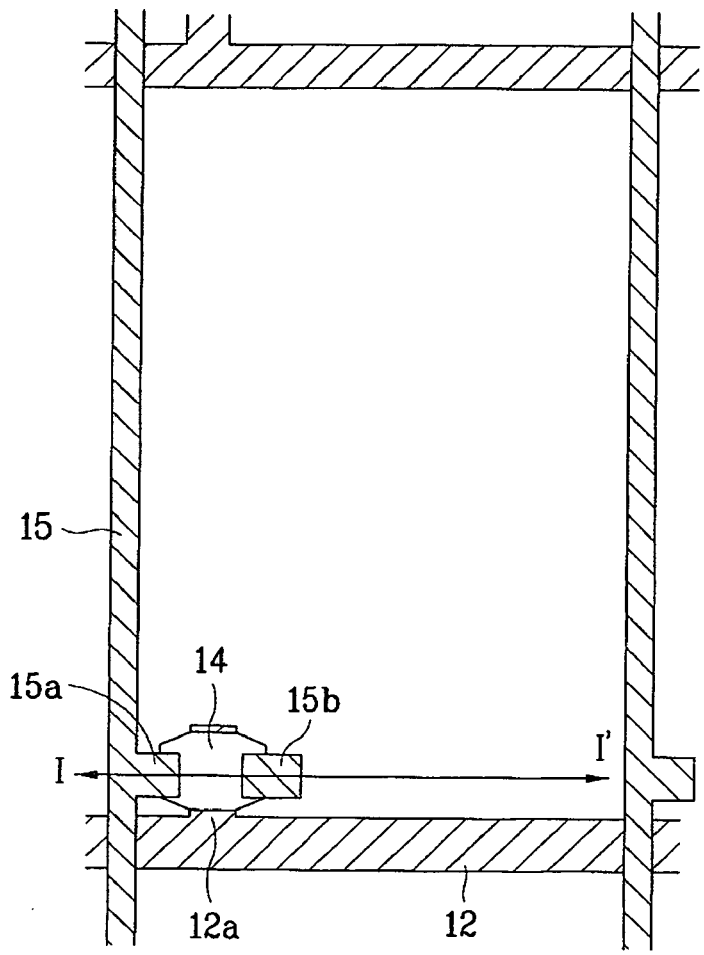
Figure 2B:
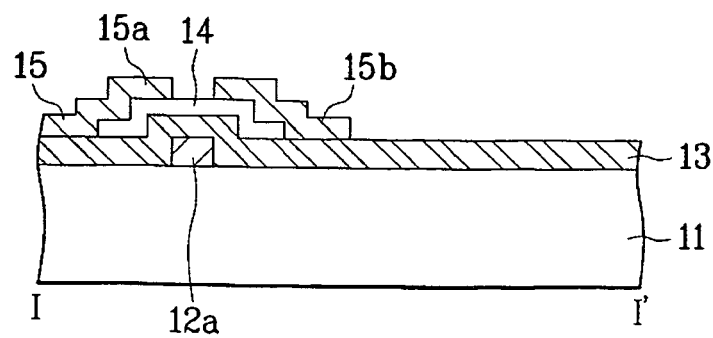
Figure 2C:
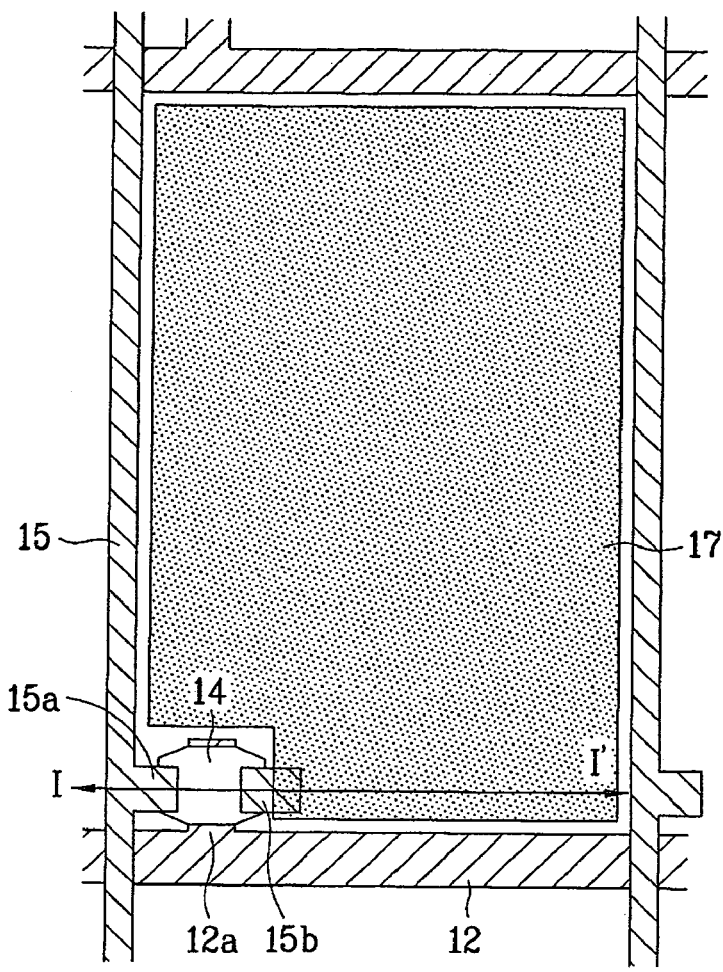
Figure 2C:
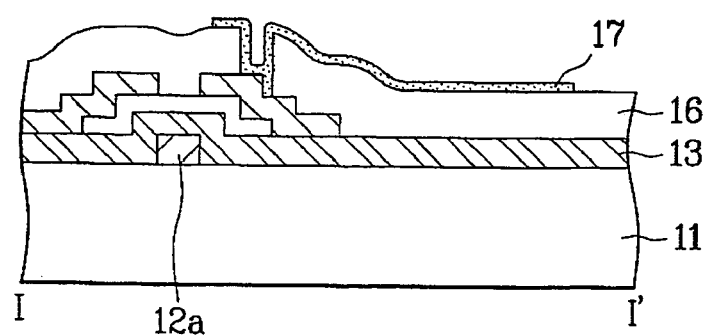
Figure 3:
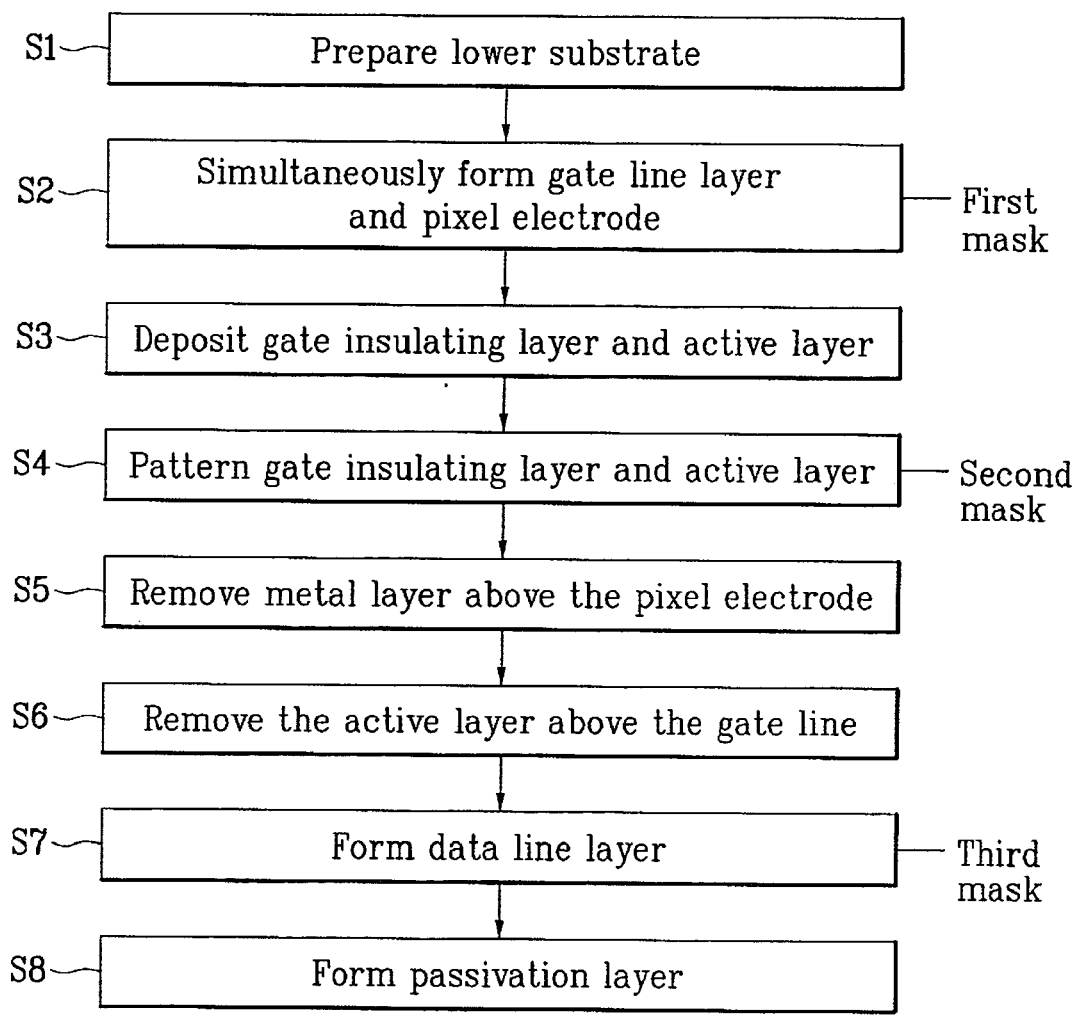
FIG. 3 is a flow chart illustrating the fabrication process of an array substrate according to the present invention.

FIG. 3 is a flow chart illustrating the fabrication process of an array substrate according to the present invention. FIG. 4A to FIG. 4H' are plan and cross-sectional views illustrating the fabrication process of an array substrate according to the present invention.

To form the array substrate of the LCD device according to the present invention, as shown in FIG. 3, a transparent conductive layer and a low-resistance metal layer are deposited on a prepared substrate, and a gate line layer and a pixel electrode layer are formed by photolithography using a first mask (S1 and S2). Then, a gate insulating layer and an active layer are sequentially formed on the gate line layer and the pixel electrode layer (S3 and S4). After that, the gate insulating layer and the active layer are patterned, and the metal layer on the pixel electrode layer is removed by photolithography using a second mask (S5). At this time, the opaque metal layer is removed from the pixel electrode, whereby the pixel electrode transmits light. Simultaneously, the metal layer corresponding to a pad electrode of a pad region is removed.

By selectively removing the active layer above the gate line, the active layer is disconnected (S6), to prevent a short between the patterns by the active layer. At this time, the method of removing the active layer above the gate line is classified into two types: first, completely removing the active layer above the gate line 1; and second partially removing the active layer above the gate line. In the latter case, diffraction exposure using a half-tone mask or a slit mask is carried out. Thereafter, a data line layer is formed by photolithography using a third mask, and then a passivation layer is formed thereon, thereby completing the array substrate (S7 and S8). Accordingly, the array substrate requires 3 masks when carrying out the steps of S2, S4 and S7.

A method for fabricating the array substrate of the LCD device according to the present invention will be described in detail below.

Figure 4A:
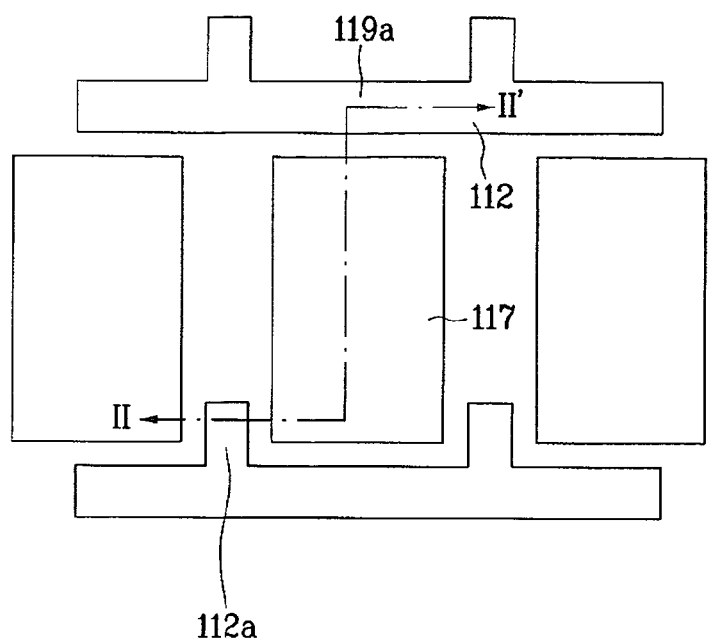
FIG. 4A to FIG. 4H' are plan and cross-sectional views illustrating the fabrication process of an array substrate according to the present invention.
Figure 4A:
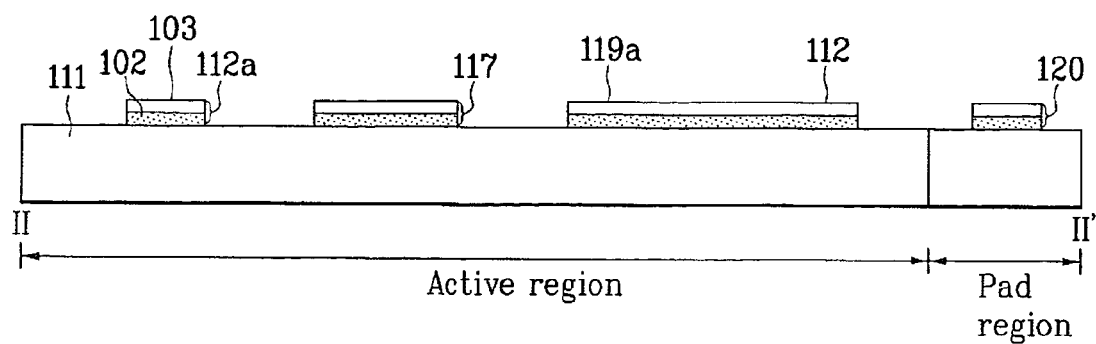

First, as shown in FIG. 4A', a transparent conductive layer 102 and a low-resistance metal layer 103 are sequentially deposited on a transparent glass substrate 111 having great heat-resistance characteristics. The transparent conductive layer 102 is formed of ITO (Indium-Tin-Oxide) or IZO (Indium-Zinc-Oxide), and the low-resistance metal layer 103 is formed of metal having low resistivity below 15 $\mu\Omega cm^{-1}$, for example, copper Cu, aluminum Al, aluminum neodymium AlNd, molybdenum Mo, chrome Cr, titanium Ti, tantalum Ta or molybdenum-tungsten MoW. When depositing ITO and aluminum Al, a contact portion of ITO and aluminum Al may be oxidized by oxygen from the ITO, so that the resistance value rises. Accordingly, it is preferable to use molybdenum Mo that does not have the bad contact characteristics with the ITO.

Then, a photoresist (not shown), for example an ultraviolet curing resin, is deposited on the entire surface of the substrate 111 including the low-resistance metal layer 103 by a spin coating or roll coating method. After covering the photoresist with a first mask having a predetermined pattern, UV-ray or X-ray radiation is irradiated thereon, whereby the photoresist is exposed and developed. Subsequently, the photoresist unetched by baking has ions implantated and is cured by UV-rays thereby obtaining a cross-linked photoresist pattern having good solution-resistance characteristics.

Next the transparent conductive layer 102 and the low-resistance metal layer 103 exposed by the patterned photoresist is wet-etched, thereby simultaneously forming a gate line 112, a gate electrode 112a, a storage lower electrode (adjacent gate line) 119a, a pixel electrode 117 and a pad electrode 120 in a pad region. At this time, an active region means a display area on a screen with pixel regions, and the pad region means an area where the pad electrode interfaces to an external driving circuit with an electric signal. The pad electrode includes gate and data pads extending from the ends of the gate and data lines in the active region.

The gate line 112, the gate electrode 112a, the storage lower electrode 119a and the pixel electrode 117 in the active region, and the pad electrode 120 of the pad region are respectively formed of the transparent conductive layer and the low-resistance metal layer. At this time, the deposition layer of the transparent conductive layer 102 and the low-resistance metal layer 103 may be wet-etched with, for example, HD (Hydrofluoric Acid), BOE (Buffered Oxide Etchant), $NH_4F$ or a mixture thereof. The wet-etching method is generally used to etch the metal material or transparent electrode, which is completed by low-priced equipment with great productivity. Further, the wet-etching method may be classified into a dipping method of dipping the substrate into a container having chemical solution and a spray method of spraying chemical solution onto the substrate.

Figure 4B:
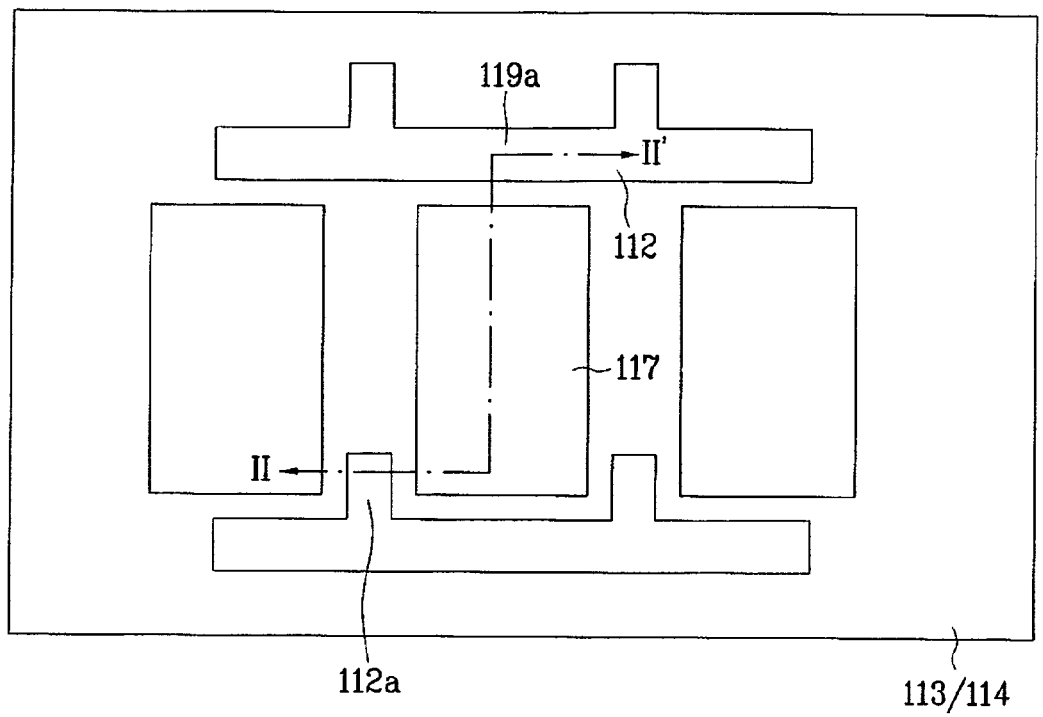
Figure 4B:
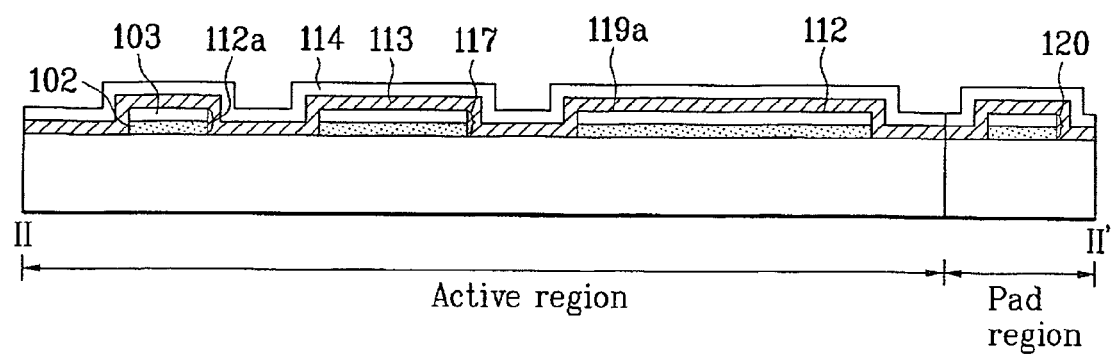

Referring to FIGS. 4B & 4B', an inorganic insulating material such as silicon nitride $SiN_x$ or silicon oxide $SiO_x$ is deposited on the entire surface of the substrate 111 including the gate electrode 112a by PECVD, thereby forming a gate insulating layer 113. Then, an amorphous silicon (a-Si) layer and an n-type amorphous silicon ($n^+$a-Si) layer doped with impurity ions are sequentially deposited on the entire surface of the substrate 111 including the gate insulating layer 113, to form an active layer 114.

Figure 4C:
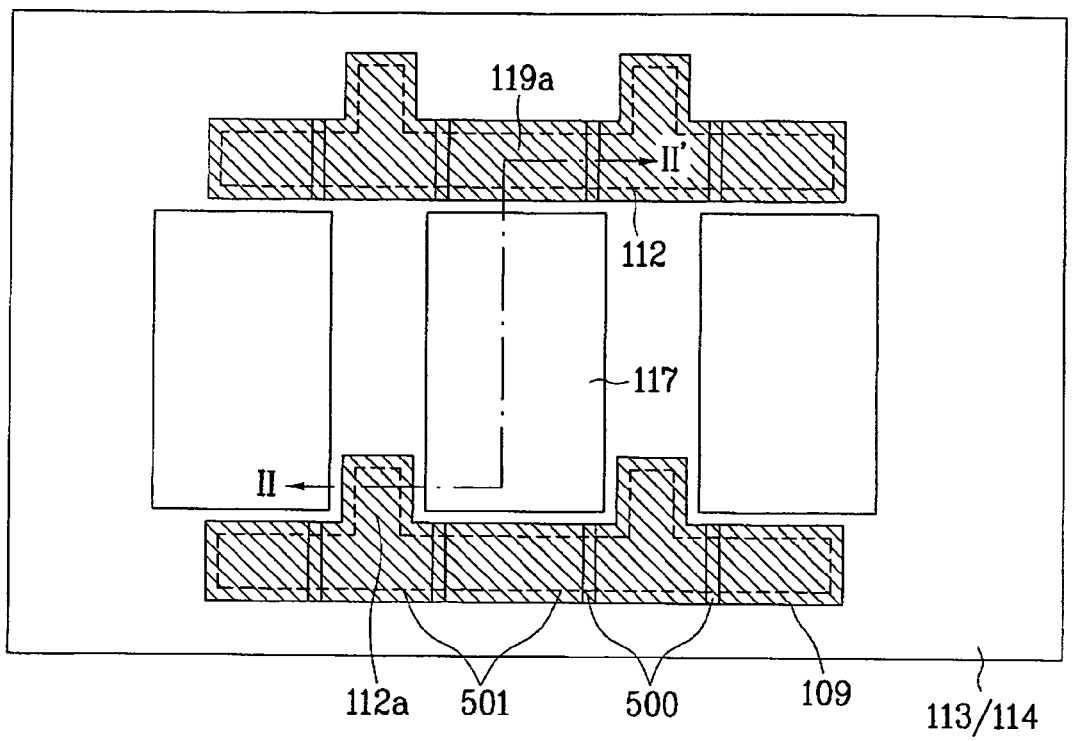
Figure 4C:
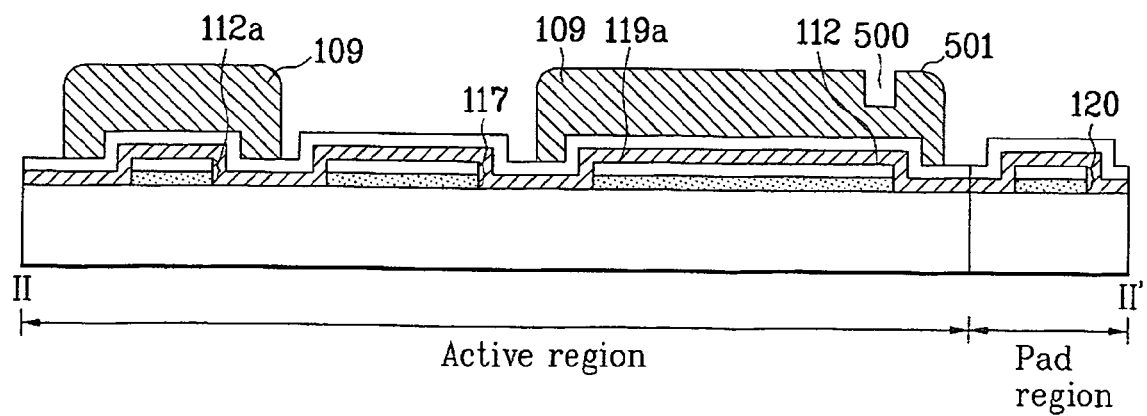

Next, as shown in FIGS. 4C & 4C', a photoresist 109 is deposited on the entire surface of the substrate 111 including the active layer 114, and diffraction exposure is carried out after covering the photoresist 109 with a half-tone mask (not shown) that is a second mask. As a result, the photoresist 109 is exposed and developed, and then a high-temperature baking, an ion implantation and an UV-ray curing process is carried out on the photoresist 109. The half-tone mask has a patterned light-shielding layer of metal on a transparent substrate, which is covered with a semi-transparent layer. Thus, the half-tone mask includes a transparent region, a semitransparent region and a closed region. In more detail, the transparent region has light transmittance of 100%, the closed region has light transmittance of 0%, and the semitransparent region has light transmittance between 0% and 100%.

After the diffraction exposure, the remaining thickness of the photoresist 109 has three different parts of a complete exposure part, a complete non-exposure part 501 and a diffraction exposure part 500. The complete exposure part corresponds to the transparent region of the half-tone mask, the complete non-exposure part corresponds to the closed region, and the diffraction exposure part corresponds to the semitransparent region. In this state, the complete exposure part of the diffraction-exposed photoresist is etched completely, the diffraction exposure part is under-etched, and the complete non-exposure part remains. However, the exposed portion is removed in the positive photoresist, and the unexposed portion is removed in the negative photoresist. Specifically, the photoresist 109 above the pixel electrode 117 and the pad electrode 120 is etched completely, and the photoresist 109 above the gate electrode 112a and the storage lower electrode 119a is not removed. Also, the photoresist 109 above the gate line 112 is diffraction-exposed, whereby the complete non-exposure part 501 and the diffraction exposure part 500 coexist.

In addition to the half-tone mask, it is possible to use a slit mask. Specifically, the slit mask is comprised of a transparent substrate, photo-shield metal layers partially covering the transparent substrate, and slits formed on some portions of the photo-shield metal layers at predetermined intervals, whereby the slit mask includes a transparent region, a semitransparent region, and a closed region. The transparent region has light transmittance of 100% because the transparent region is not covered with the photo-shield metal layer, the closed region has light transmittance of 0% because the closed region is covered with the photo-shield metal layer, and the semitransparent region has light transmittance between 0% and 100% because the plurality of slits are respectively formed between the photo-shield metal layers. In this case, the light transmittance of the semitransparent region depends on the density of slits.

In the meantime, unlike the aforementioned embodiment of the present invention, another embodiment of the present invention has the diffraction exposure part exposes the photoresist above the gate line. In the previous embodiment of the present invention the photoresist above the gate line includes photoresist having the diffraction exposure part and the complete non-exposure part, and the active layer above the gate line is partially removed in the diffraction exposure part. In the current embodiment of the present invention, the photoresist above the gate line includes the photoresist having only diffraction exposure part, and the active layer above the gate line is removed completely. As a result, the area of the active layer removed above the gate line depends on the diffraction exposure part of the photoresist above the gate line.

Figure 4D:
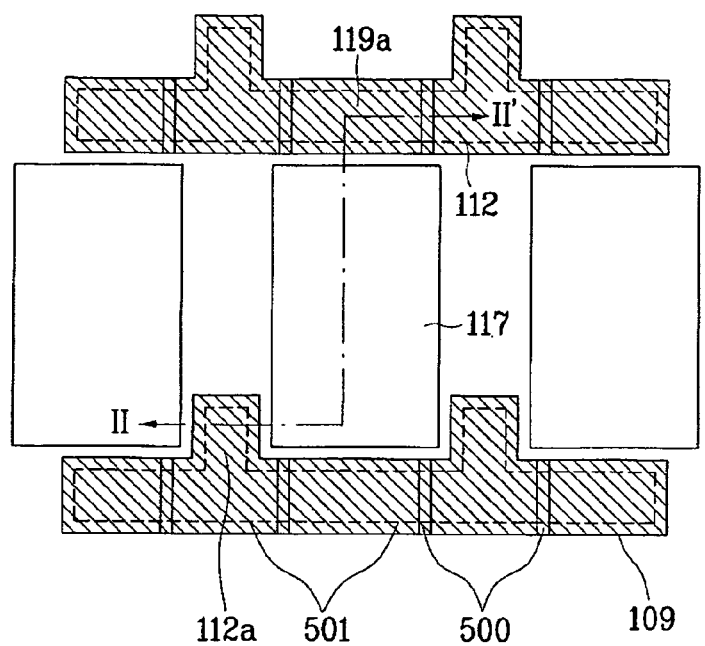
Figure 4D:
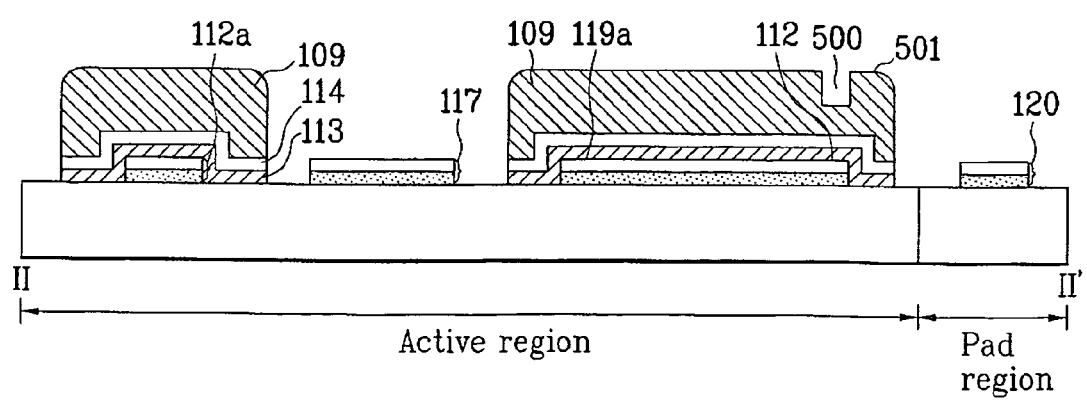

As shown in FIG. 4D', the active layer 114 and a gate insulating layer 113 are dry-etched by using the photoresist 109 as a mask. In the dry-etching method, gas is sprayed into a chamber with a high pressure state and transformed to a plasma state, whereby positive ion or radical etches a predetermined portion of a layer requiring the etching. It is possible to obtain great pattern accuracy by dry-etching method the insulating layer. Dry-etching methods may be divided into PE (Plasma Etching), RIE (Reactive Ion Etching), MERIE (Magnetically Enhanced Reactive Ion Etching), ECR (Electron Cyclotron Resonance), and TCP (Transformer Coupled Plasma) modes according to the method of forming the plasma. Among them, PE and RIE modes are most generally used for the fabrication process of the LCD device.

According to the aforementioned dry-etching method, the area having the photoresist 109, such as the deposition layer of the active layer 114 and the gate insulating layer 113 above the gate electrode 112a, the storage lower electrode 119a and the gate line 112, is not etched. Meanwhile, the area having no photoresist, such as the deposition layer of the active layer 114 and the gate insulating layer 113 above the pixel electrode 117 and the pad electrode 120, is etched.

Figure 4E:
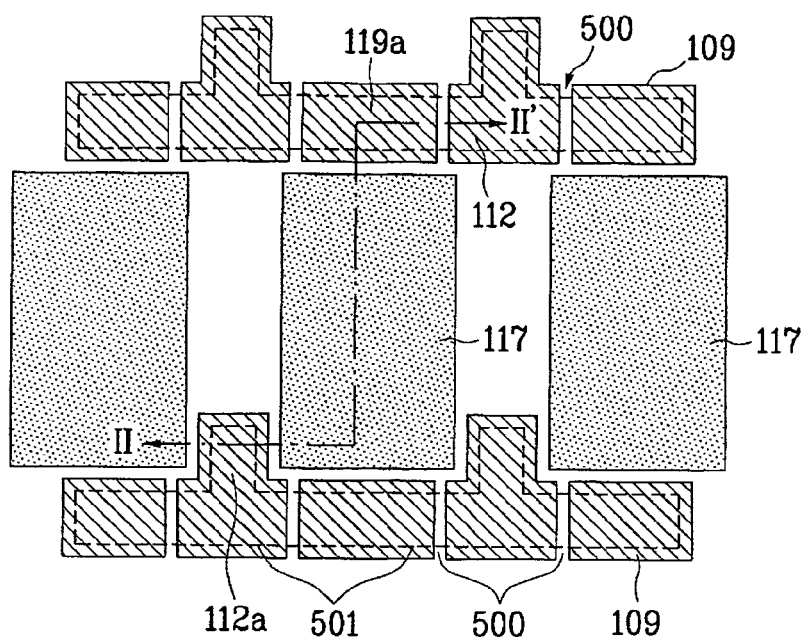
Figure 4E:
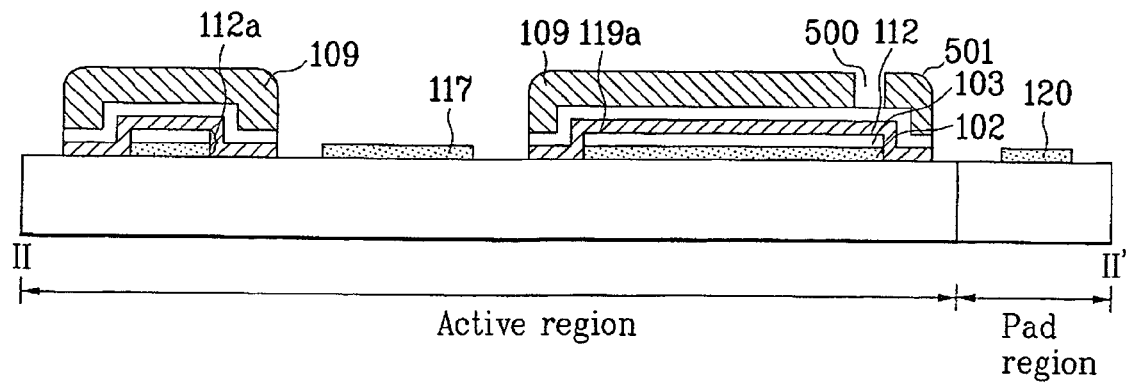

Subsequently, as shown in FIG. 4E', the exposed portion of the photoresist 109 is wet-etched, thereby removing the low-resistance metal layer 103 of the pixel electrode 117 and the pad electrode 120. Accordingly, the pixel electrode 117 and the pad electrode 120 have changed from a dual-layered structure of the transparent conductive layer 102 and the low-resistance metal layer 103 to a single-layered structure of the transparent conductive layer 102. After that, the active layer 114 corresponding to the diffraction exposure part 500 is exposed by ashing the photoresist 109. By ashing, it is possible to decrease the step coverage of the photoresist 109 between the gate electrode 112a and the storage lower electrode 119a, thereby decreasing the step coverage of the photoresist 109 of the complete non-exposure part 501 above the gate line 112.

Figure 4F:
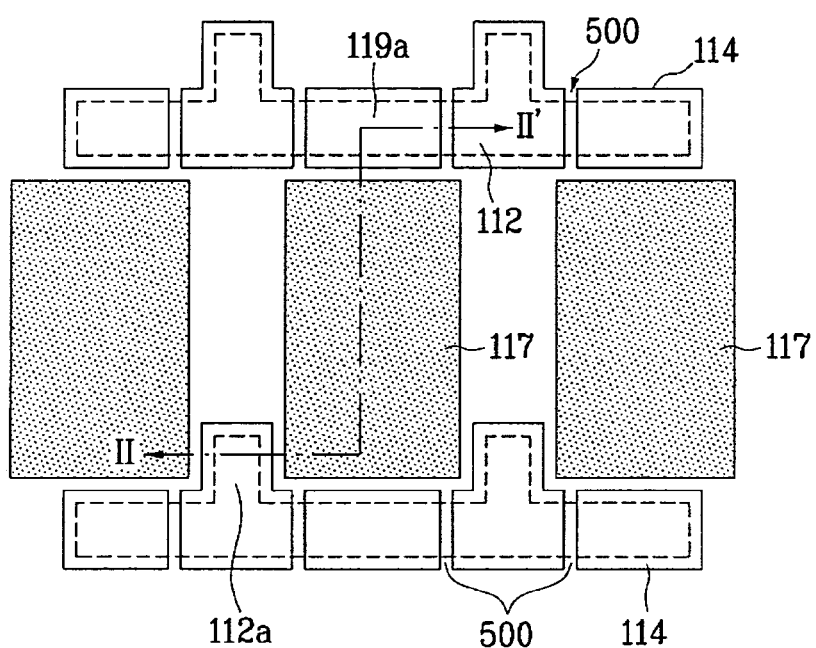
Figure 4F:
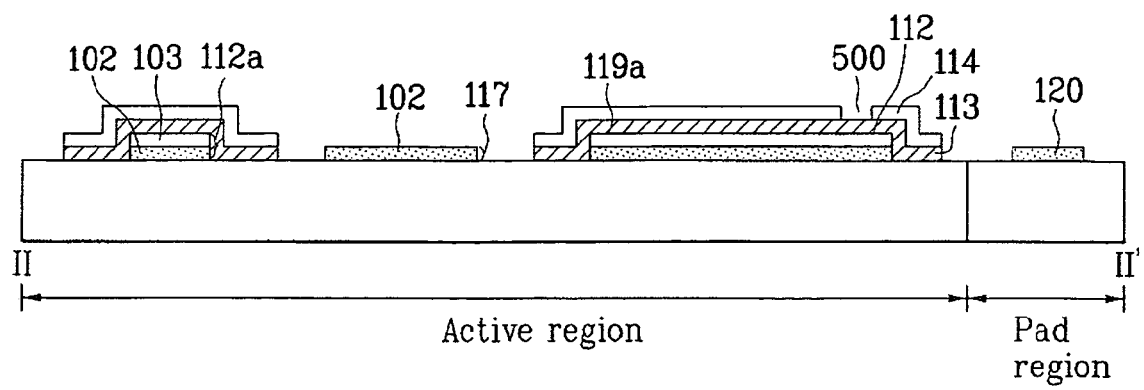

Thereafter, the exposed active layer 114 corresponding to the diffraction exposure part 500 is dry-etched, and the remaining photoresist 109 is stripped, thereby forming the pattern shown in FIGS. 4F & 4F'. That is, the active layer 114 above the gate line is partially removed. As described above, the active layer 114 of the diffraction exposure part 500 is partially removed and disconnected, so that it is possible to prevent shorts from developing between the thin film transistor and the storage by the active layer 114.

In this case, the gate electrode 112a, the storage lower electrode 119a and the gate line 112 are respectively formed of the transparent conductive layer 102 and the low-resistance metal layer 103, and the pixel electrode 117 and the pad electrode 120 of the pad region are respectively formed of the single layer of the transparent conductive layer 102. Also, the gate insulating layer 113 and the active layer 114 remain above the gate electrode 112a and the storage lower electrode 119a, and the gate insulating layer 113 and the partially etched active layer 114 remain above the gate line 112.

In another embodiment of the present invention, the active layer 114 above the gate line 112 is removed completely, whereby it is possible to prevent shorts between the thin film transistor and the storage. By completely removing the active layer above the gate line, the active layer 114 remains on the gate electrode 112a and the storage lower electrode 119a.

Figure 4G:
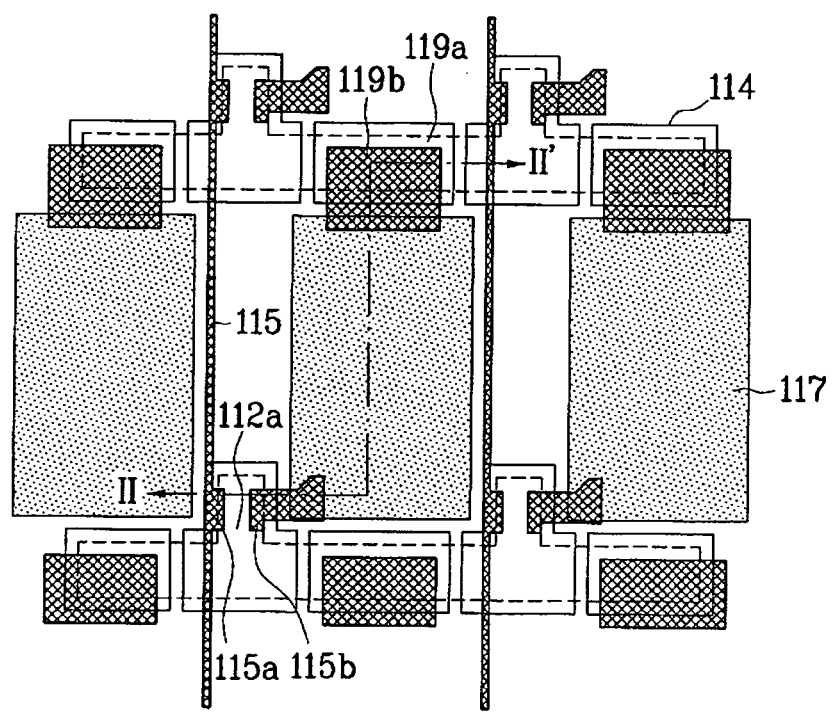
Figure 4G:
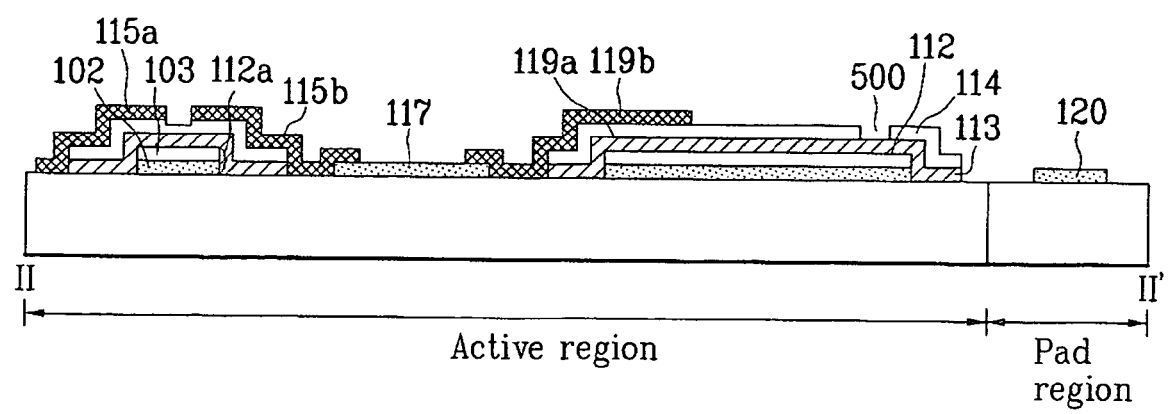

Subsequently, as shown in FIGS. 4G & 4G', a low-resistance metal layer of copper Cu, aluminum Al, aluminum neodymium AlNd, molybdenum Mo, chrome Cr, titanium Ti, tantalum Ta, molybdenum-tungsten MoW, etc. is deposited on the entire surface of the substrate including the active layer 114, and patterned by photolithography using a third mask, thereby forming a data line 115, a source electrode 115a, a drain electrode 115b and a storage upper electrode 119b.

The data line 115 is substantially perpendicular to the gate line 112, to define a unit pixel region. Also, the source electrode 115a and the drain electrode 115b are formed at both sides of the active layer 114 above the gate electrode 112a, thereby forming the thin film transistor. The storage upper electrode 119b overlaps with the storage lower electrode 119b with the gate insulating layer 113 interposed therebetween, thereby forming the storage capacitor. At this time, the drain electrode 115b is connected with the pixel electrode 117 to transmit a signal of the thin film transistor to the pixel electrode 117, and the storage lower electrode 119b is connected with the pixel electrode 117 to maintain the received voltage.

Figure 4H:
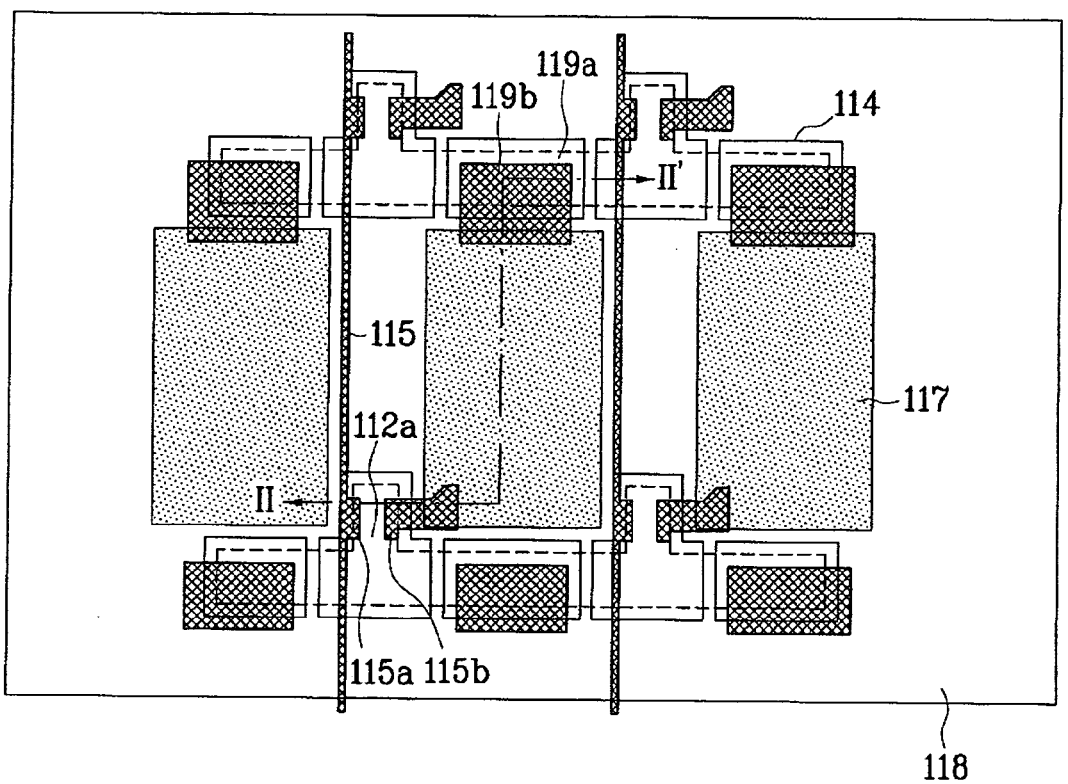
Figure 4H:
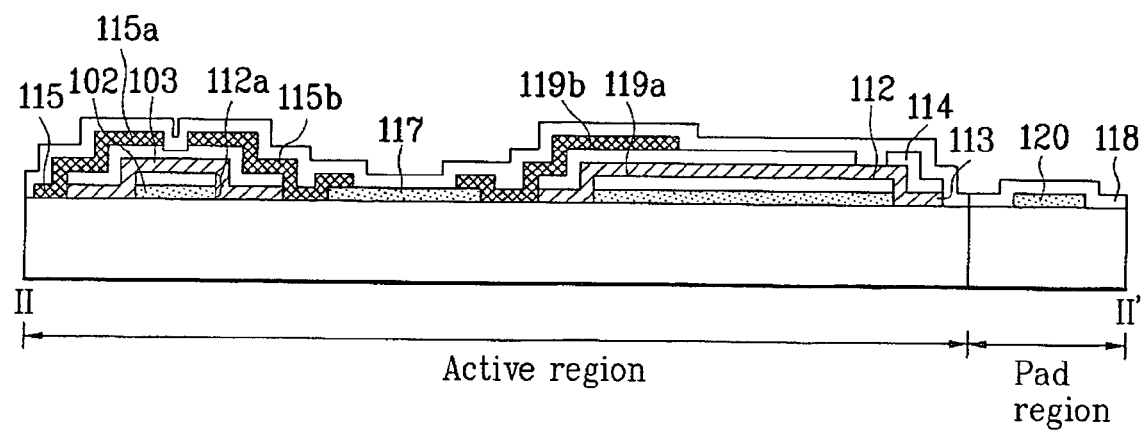

As shown in FIGS. 4H & 4H', an inorganic insulating material of silicon nitride or silicon oxide is deposited on the entire surface of the substrate including the data line 115 by PECVD, thereby forming a passivation layer 118. Instead of the inorganic insulating material, the passivation layer 118 may also be formed of an organic insulating material such as BCB or acryl-type material. In addition, it is possible to form an alignment layer serving as the passivation layer 118, without the additional formation of the passivation layer 118.

After forming the passivation layer 118, the passivation layer 118 above the pad electrode 120 of the pad region is opened, to be in contact with a driving circuit providing a driving signal, wherein data input signals provided from the driving circuit are divided according to a control signal, and then transmitted to the respective pixel regions.

The pad electrode may be exposed using various methods, for example, an HF dipping method, an atmospheric pressure plasma etching method and a laser etching method. In the case of the HF dipping method, after the lower and upper substrates are bonded to each other without opening the passivation layer, the exposed pad region of the bonded substrates is dipped into the etchant. Also, the atmospheric pressure plasma etching method opens the passivation layer by flowing plasma to the pad region through a nozzle at an atmospheric pressure state. In the laser etching method, the passivation layer of the pad region is directly etched with a laser. Further, before bonding the two substrates, the passivation layer may be dry-etched and opened by using a patterned alignment layer as the mask.

The aforementioned method according to the present invention requires 3 masks to form the array substrate, whereby it is suitable as a low-mask technology. Although not shown, the array substrate is bonded to an opposing substrate having a color filter layer and a common electrode, and then liquid crystal is injected between the two substrates, to form a liquid crystal layer. After that, an inlet for injection of liquid crystal is sealed, thereby completing the LCD device.

As mentioned above, the array substrate of the LCD device according to the present invention and the method for fabricating the same have following advantages.

The method for fabricating the array substrate of the LCD device according to the present invention requires 3 masks in the steps of forming the gate line and the pixel electrode, patterning the active layer, and forming the data line, whereby it is suitable as a low-mask technology. As a result, it is possible to decrease the fabrication cost and time, and probability of fabrication error by decreasing the number count of masks used.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for fabricating an array substrate of an LCD device comprising:

simultaneously forming a gate line, a gate electrode and a pixel electrode on a substrate;

depositing a gate insulating layer and an active layer on an entire surface of the substrate including the gate line;

patterning the gate insulating layer and the active layer to remain on the gate line and the gate electrode;

selectively removing the active layer above the gate line;

forming a data line substantially perpendicular to the gate line and source/drain electrodes; and depositing a passivation layer on the entire surface of the substrate including the data line.

2. The method of claim 1, wherein a transparent conductive layer and a low-resistance metal layer are sequentially deposited when forming the gate line, the gate electrode and the pixel electrode.

3. The method of claim 2, wherein the transparent conductive layer is formed of one of ITO (Indium-Tin-Oxide) and IZO (Indium-Zinc-Oxide).

4. The method of claim 2, wherein the low-resistance metal layer is formed of one of copper Cu, aluminum Al, aluminum neodymium AlNd, molybdenum Mo, chrome Cr, titanium Ti, tantalum Ta and molybdenum-tungsten MoW.

5. The method of claim 2, further comprising removing the low-resistance metal layer of the pixel electrode after patterning the gate insulating layer and the active layer.

6. The method of claim 1, wherein the active layer above the gate line is completely removed when selectively removing the active layer above the gate line.

7. The method of claim 1, wherein the active layer above the gate line is partially removed when selectively removing the active layer above the gate line.

8. The method of claim 1, wherein forming the data line includes forming a storage upper electrode overlapping the adjacent gate line and electrically connected with the pixel electrode.

9. The method of claim 1, wherein a pad electrode extends from the gate line and another pad electrode extends from the data line.

10. The method of claim 1, wherein patterning the gate insulating layer and the active layer includes:

depositing a photoresist on the gate insulating layer and the active layer;

patterning the photoresist to remain on the gate line and the gate electrode by diffraction exposure; and etching the gate insulating layer and the active layer by using the patterned photoresist as a mask.

11. The method of claim 10, wherein the photoresist patterned by the diffraction exposure is thinner than rest of the photo resist.

12. The method of claim 11, wherein selectively patterning the active layer above the gate line includes:

removing the thin portion of the photoresist by ashing; and selectively removing a portion of the active layer by using the ashed photoresist as a mask.

13. The method of claim 10, wherein one of a half-tone mask and a slit mask is used for the diffraction exposure process.

14. A method for fabricating an array substrate of an LCD device comprising:

depositing a conductive layer on a substrate, and simultaneously forming a gate line, a gate electrode and a pixel electrode by photolithography using a first mask;

forming a gate insulating layer, a semiconductor layer and a photoresist on an entire surface of the substrate including the gate line, and patterning the gate insulating layer and the semiconductor layer to remain on the gate electrode and the gate line by patterning the photoresist with a diffraction exposure process using a second mask;

selectively removing the semiconductor layer above the gate line after ashing the photoresist; and depositing a metal layer on the entire surface of the substrate including the semiconductor layer, and forming a data line and source/drain electrodes using a third mask.

15. The method of claim 14, wherein a transparent conductive layer and a low-resistance metal layer are sequentially deposited in the step of forming the gate line, the gate electrode and the pixel electrode.

16. The method of claim 15, further comprising removing the low-resistance metal layer of the pixel electrode when patterning the gate insulating layer and the semiconductor layer.

17. The method of claim 15, wherein the transparent conductive layer is formed of one of ITO (Indium-In-Oxide) and IZO (Indium-Zinc-Oxide).

18. The method of claim 15, wherein the low-resistance metal layer is formed of one of copper Cu, aluminum Al, aluminum neodymium AlNd, molybdenum Mo, chrome Cr, titanium Ti, tantalum Ta and molybdenum-tungsten MoW.

19. The method of claim 14, wherein the semiconductor layer above the gate line is completely removed when selectively removing the semiconductor layer above the gate line.

20. The method of claim 14, wherein the semiconductor layer above the gate line is partially removed when selectively removing the semiconductor layer above the gate line.

21. The method of claim 14, wherein the second mask is formed of one of a half-tone mask and a slit mask.

* * * * *